US012812993B2

(12) United States Patent
Hsieh

(10) Patent No.: US 12,812,993 B2
(45) Date of Patent: Nov. 24, 2026

(54) OPTICAL SENSOR PACKAGE

(71) Applicant: SEMICONDUCTOR COMPONENTS INDUSTRIES, LLC, Scottsdale, AZ (US)

(72) Inventor: Yu-Te Hsieh, Taoyuan City (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 713 days.

(21) Appl. No.: 18/179,744

(22) Filed: Mar. 7, 2023

(65) Prior Publication Data

US 2024/0304639 A1 Sep. 12, 2024

(51) Int. Cl.
*H10F 39/00* (2025.01)
*H10W 72/00* (2026.01)
(Continued)

(52) U.S. Cl.
CPC .......... *H10F 39/804* (2025.01); *H10F 39/811* (2025.01); *H10W 72/013* (2026.01);
(Continued)

(58) Field of Classification Search
CPC ......... H01L 24/27; H01L 24/83; H01L 24/32; H01L 24/29; H01L 24/48; H01L 24/05; H01L 24/49; H01L 24/06; H01L 23/3157; H01L 25/167; H01L 2224/2919; H01L 2224/27416; H01L 2224/27436; H01L 2224/48091; H01L 2224/48225; H01L 2224/27618; H01L 2224/29011; H01L 2224/32225; H01L 2224/29013; H01L 2224/83192; H01L 2924/0665; H01L 2224/83201; H01L 2224/83862; H01L 2224/83874; H01L 2224/83856; H01L 2224/27901; H01L 2224/05624; H01L 2224/27848; H01L 2224/29082; H01L 2224/73265; H01L 2224/49175; H01L 2224/32058; H01L 2224/06165; H01L 2224/06131; H01L 2224/06155; H01L 2224/73215; H01L 2224/49171; H01L 2224/8592; H01L 2224/05568; H01L 2224/04042; H01L 2224/83193;
(Continued)

(56) References Cited

U.S. PATENT DOCUMENTS

2006/0145325 A1 7/2006 Yang et al.
2008/0217715 A1 9/2008 Park et al.
(Continued)

*Primary Examiner* — Mouloucoulaye Inoussa
(74) *Attorney, Agent, or Firm* — Brake Hughes Bellermann LLP

(57) ABSTRACT

An optical sensor module includes a transparent lid spaced apart from the optical sensor die by a protective dam. The dam can be formed by photosensitive epoxy materials that can be patterned using a photolithography process. The epoxy materials can change between liquid and solid phases during assembly, and then can be fully hardened by curing. The protective dam can be formed as a single layer, or as a multi-layer stack of epoxy materials, in which the layers may have different properties. In some implementations, the epoxy dam acts as a spacer that provides a substantially uniform gap to minimize a tilt angle of the transparent lid with respect to the optical sensor.

20 Claims, 8 Drawing Sheets

(51) Int. Cl.
*H10W 72/30* (2026.01)
*H10W 72/90* (2026.01)
*H10W 90/00* (2026.01)

(52) U.S. Cl.
CPC ................. *H10W 72/01333* (2026.01); *H10W 72/01336* (2026.01); *H10W 72/01351* (2026.01); *H10W 72/01365* (2026.01); *H10W 72/073* (2026.01); *H10W 72/07332* (2026.01); *H10W 72/07338* (2026.01); *H10W 72/322* (2026.01); *H10W 72/331* (2026.01); *H10W 72/332* (2026.01); *H10W 72/354* (2026.01); *H10W 72/952* (2026.01); *H10W 90/734* (2026.01); *H10W 90/754* (2026.01)

(58) Field of Classification Search
CPC ......... H01L 2224/29015; H10F 39/804; H10F 39/811; H10F 77/93; H10F 77/50; H10F 39/809; H10F 39/8063; H10F 39/018; H10F 39/026; H10F 39/8023; H10H 20/8506
See application file for complete search history.

(56) References Cited

U.S. PATENT DOCUMENTS

| | | | | |
|---|---|---|---|---|
| 2009/0046183 | A1* | 2/2009 | Nishida | H10F 39/804 438/66 |
| 2011/0024610 | A1 | 2/2011 | Tu et al. | |
| 2011/0024862 | A1* | 2/2011 | Tu | H10F 39/804 257/434 |
| 2012/0313203 | A1* | 12/2012 | Fuse | H10F 39/804 257/E31.127 |
| 2015/0011038 | A1* | 1/2015 | Huang | H10F 39/804 438/66 |
| 2018/0019274 | A1* | 1/2018 | Yang | H10F 39/804 |
| 2020/0373341 | A1* | 11/2020 | Jo | H10F 39/804 |
| 2021/0305437 | A1* | 9/2021 | Liu | H10F 39/804 |
| 2022/0085086 | A1* | 3/2022 | Kim | H10F 39/8063 |
| 2022/0123035 | A1* | 4/2022 | Seo | H10F 39/804 |
| 2023/0207708 | A1* | 6/2023 | Liu | H10F 39/804 257/738 |

* cited by examiner

OPTICAL SENSOR PACKAGE

TECHNICAL FIELD

This description relates to assembling and packaging semiconductor device modules, semiconductor device assemblies, and semiconductor devices. More specifically, this description relates to a semiconductor device module that includes an optical sensor.

BACKGROUND

Semiconductor device assemblies, such as assemblies including image sensors, can be implemented using one or more semiconductor dies, one or more substrates, e.g., direct-bonded metal (DBM) substrates, and electrical interconnections such as bond wires, conductive spacers and conductive clips. A molding compound, e.g., an epoxy molding compound, can be used as an encapsulant to protect components of a semiconductor device assembly. Semiconductor device assemblies that include image sensors can be used in a number of image-processing applications, including cameras, smart phones, video surveillance equipment, automotive systems, and industrial applications.

SUMMARY

In some aspects, the techniques described herein relate to an apparatus, including: a substrate; an optical sensor die coupled to an upper surface of the substrate; a multi-layer epoxy dam bonded to the optical sensor die; a transparent lid coupled to the multi-layer epoxy dam; a wire bond providing an electrical connection between the optical sensor die and circuit elements in the substrate; and an encapsulant disposed around at least a portion of the transparent lid, the multi-layer epoxy dam, the optical sensor die, and the wire bond.

In some aspects, the techniques described herein relate to an apparatus, wherein the transparent lid is rectangular, and the multi-layer epoxy dam is disposed around a perimeter of the transparent lid.

In some aspects, the techniques described herein relate to an apparatus, further including solder balls attached to a lower surface of the substrate.

In some aspects, the techniques described herein relate to an apparatus, wherein the encapsulant is a liquid epoxy solidified by thermally curing.

In some aspects, the techniques described herein relate to an apparatus, wherein the substrate includes one or more of a ceramic material, a glass material, a semiconductor material, an organic material, a resin material, a laminate, and a printed circuit board.

In some aspects, the techniques described herein relate to an apparatus, wherein layers of the multi-layer epoxy dam are photosensitive layers.

In some aspects, the techniques described herein relate to an apparatus, wherein the photosensitive layers of the multi-layer epoxy dam are patterned using the same dimensions, to form a uniform stack.

In some aspects, the techniques described herein relate to an apparatus, wherein the transparent lid has an area between 9 mm2 and 100 mm2.

In some aspects, the techniques described herein relate to an apparatus, wherein the transparent lid has a thickness between 200 μm and 1 mm.

In some aspects, the techniques described herein relate to an apparatus, wherein the multi-layer epoxy dam is a two-layer epoxy dam having a total thickness between 30 μm and 100 μm.

In some aspects, the techniques described herein relate to an apparatus, wherein the two-layer epoxy dam includes a fully cured C-stage adhesive layer and a fully cured B-stage adhesive layer.

In some aspects, the techniques described herein relate to a method, including: forming a photosensitive adhesive layer on a glass substrate; patterning the photosensitive adhesive layer; singulating the glass substrate along a singulation boundary of the patterned photosensitive adhesive layer to create: at least a portion of a transparent lid, and at least a portion of a dam; and assembling a chip package that includes the dam disposed around a perimeter of the transparent lid.

In some aspects, the techniques described herein relate to a method, wherein patterning the photosensitive adhesive layer includes spin coating a liquid type adhesive onto the glass substrate.

In some aspects, the techniques described herein relate to a method, wherein patterning the photosensitive adhesive layer includes applying the photosensitive adhesive layer to the glass substrate using a lamination process.

In some aspects, the techniques described herein relate to a method, further including curing the photosensitive adhesive layer.

In some aspects, the techniques described herein relate to a method, including: forming a first photosensitive adhesive layer on a transparent substrate; patterning the first photosensitive adhesive layer to form a first patterned photosensitive adhesive layer; curing the first photosensitive adhesive layer; forming a second photosensitive adhesive layer on the first photosensitive layer; patterning the second photosensitive adhesive layer to form a second patterned photosensitive adhesive layer; singulating the glass substrate along a boundary of the first patterned photosensitive adhesive layer and second patterned photosensitive adhesive layer to create: at least a portion of a transparent lid, and at least a portion of a two-layer dam; and assembling a chip package that includes the two-layer dam disposed around at least a portion of a perimeter of the transparent lid; and curing the two-layer dam.

In some aspects, the techniques described herein relate to a method, wherein curing the first photosensitive adhesive layer includes heating the first photosensitive adhesive layer to a temperature in a range of about 100 to about 200 degrees C.

In some aspects, the techniques described herein relate to a method, wherein patterning the second photosensitive adhesive layer includes patterning the second photosensitive adhesive layer to have a pitch between 200 μm and 500 μm.

In some aspects, the techniques described herein relate to a method, wherein assembling the chip package includes attaching the two-layer dam to an optical sensor die.

In some aspects, the techniques described herein relate to a method, wherein curing the two-layer dam transforms a B-stage material into a C-stage material.

Figure 1A:
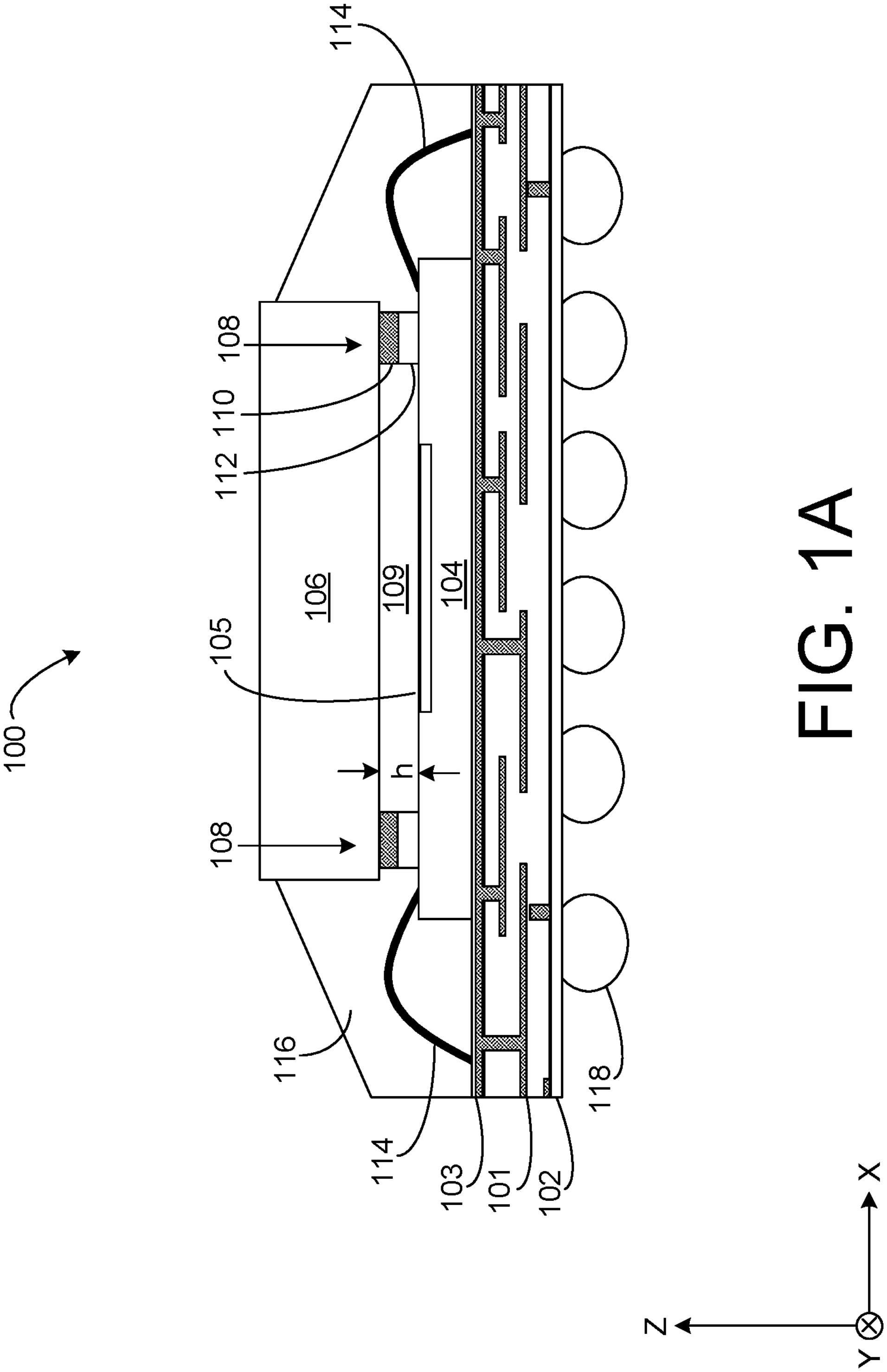
FIG. 1A is a cross-sectional view of an optical sensor module equipped with a protective dam, according to an implementation of the present disclosure.

Aspects of the present disclosure are best understood from the following detailed description when read with the accompanying figures. It is noted that, in accordance with common practice in the industry, various features are not necessarily drawn to scale. Dimensions of the various features may be arbitrarily increased or reduced for clarity of discussion. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

Current implementations of semiconductor device assemblies such as, for example, an optical sensor die, e.g., an image sensor die, a complementary metal-oxide-semiconductor (CMOS) image sensor die, may have certain drawbacks. For instance, current implementations may be assembled into a chip package, e.g., an integrated ball grid array (iBGA) package, that includes a liquid resin material that is initially in liquid form and later solidifies in response to applied heat and/or pressure. In some instances, the liquid resin serves as an adhesive (e.g., epoxy) to bond a glass lid to the optical sensor die. The glass lid covers and protects the optical sensor while transmitting light to an active area (e.g., central active area) of the optical sensor die. Once it is in place, the liquid resin further serves to exclude an encapsulant from bleeding onto the optical sensor die, and in particular, onto the active area of the optical sensor die. However, as dimensions of the package and the optical sensor die shrink with each new semiconductor technology generation, the non-active area of the sensor die that is available to accommodate bonding agents is reduced. With tighter dimensions, there is an increased risk that the liquid resin itself can bleed onto the active area of the optical sensor die, thus contaminating the sensor. In addition, the liquid resin may not have a well-controlled thickness, thus allowing the glass lid to tilt at an angle relative to the top surface of the optical sensor die instead of lying flat.

This disclosure relates to implementations of semiconductor device assemblies, including optical sensors, in which the package does not include a liquid resin. Instead, a protective dam can be formed into a more precise shape from other types of epoxy materials that can change between liquid and solid phases during assembly, and then can be fully hardened by curing. In some implementations, the protective dam can be formed as a single layer of epoxy. In some implementations, the protective dam can be formed as a multi-layer stack of epoxy materials, in which the layers may have different properties. In some implementations, the protective dam (e.g., epoxy dam) also acts as a spacer that provides a substantially uniform gap between the optical sensor and the glass lid to better control the tilt angle.

FIG. 1A is a cross-sectional view of an optical sensor module 100, in accordance with some implementations of the present disclosure. In some implementations, the optical sensor module 100 includes a substrate 101 having a lower surface 102 and an upper surface 103, a sensor die 104 having an active area 105, a transparent lid 106, a protective dam 108, wire bonds 114. The optical sensor module 100 further includes packaging components such as an encapsulant 116, and solder balls 118 (or any other type of conductive contact or conductive ball).

In some implementations, the substrate 101 can include a ceramic material, a glass material, a semiconductor material, an organic material, a resin material, a laminate, or a printed circuit board. In some implementations, the substrate 101 can include a portion of a semiconductor wafer having integrated circuit components such as transistors and interconnects, e.g., layers of metallization, formed therein. For example, the substrate 101 can be made of, or can include silicon, silicon carbide (SiC), or III-V semiconductor materials such as gallium arsenide (GaAs), indium phosphide (InP), and so forth. In some implementations, the substrate 101 can be a glass substrate or a sapphire substrate.

In the example shown in FIG. 1A, the substrate 101 includes an interconnect layer formed in the lower surface 102, or back side of the substrate 101, and an interconnect layer formed in the upper surface 103, or front side of the substrate 101. The interconnect layers may be metal layers, e.g., metal pads or patterned metal layers that form wire interconnects. For example, the upper surface 103 of the substrate 101 can be an interconnect layer that provides signal paths, e.g., metal lines, or optical fiber connectors, to underlying devices. The back side of the substrate 101 can support solder balls 118 that are in contact with the lower surface 102, e.g., a layer of metallization on the back side of the substrate 101. In some implementations, the solder balls 118 can be used to mount the substrate 101 to platforms such as a printed circuit board (PCB), a package, or to another device. Other mechanisms or materials for bonding the substrate 101 to such platforms can be used instead of the solder balls 118, such as, for example, direct bonding.

In some implementations, the sensor die 104 can be a semiconductor die that includes an optical sensor, that is, an optical sensor that includes metal-oxide-semiconductor field effect transistors (MOSFETs) and related integrated circuit components. The sensor die 104 can be attached to, e.g., disposed on, mounted to, coupled to, or in direct contact with, the upper surface 103 of the substrate 101. A central region of the sensor die 104 can be the active area 105, e.g., a region formed on an epitaxial layer of the sensor die 104. The active area 105 of the sensor die 104 may include electronic components configured with photosensitive elements to sense light, e.g., reflected light from a target, or external object, that will form a digital image of the targe. In some implementations, a sensor within the active area 105 on the sensor die 104 can have a thickness in a range of about 100 μm to about 500 μm, and the sensor die 104 can have a total area in a range of about 9 $mm^2$ to about 400 $mm^2$.

The wire bonds 114 can extend from metal contact pads, e.g., aluminum pads, disposed at edges of the sensor die 104 to the interconnect layers in the upper surface 103 of the substrate 101. The wire bonds 114 provide electrical connections, e.g., data transmission paths, between circuit elements on the sensor die 104 and devices formed in the substrate 101, e.g., electronic devices that may process or store image information sensed by the sensor die 104. The wire bonds 114 can be supported and protected by the encapsulant 116, which surrounds the wire bonds 114, the sensor die 104, and at least portions of the sidewalls of the transparent lid 106.

Light detected by the sensor die 104 can be received through the transparent lid 106, which may provide environmental protection for at least the active area 105 of the sensor die 104. The transparent lid 106 can be made of glass or a transparent polymer material that has suitable optical properties such as, for example, PMMA, acrylic, transparent forms of polyvinyl chloride (PVC), or similar materials. In some implementations, the transparent lid 106 can have light filtering properties, e.g., polarization, that can reduce reflections and glare in images formed by the sensor die 104. The transparent lid 106 has a thickness t, and can be spaced apart from the sensor die 104 by a gap 109, having a gap height h. One or both of the thickness t and the gap height h may be chosen so as to preserve or enhance the quality of images formed by the sensor die 104. For example, the gap height h of the gap 109 can be in a range of about 30 μm and about 100 μm, and the thickness t of the transparent lid 106 can be in a range of about 200 μm to about 1 mm. The transparent lid 106 is protected by the encapsulant 116, which wraps around sides of the transparent lid 106. The encapsulant 116 assists in preventing mechanical damage to the transparent lid 106.

Figure 1B:
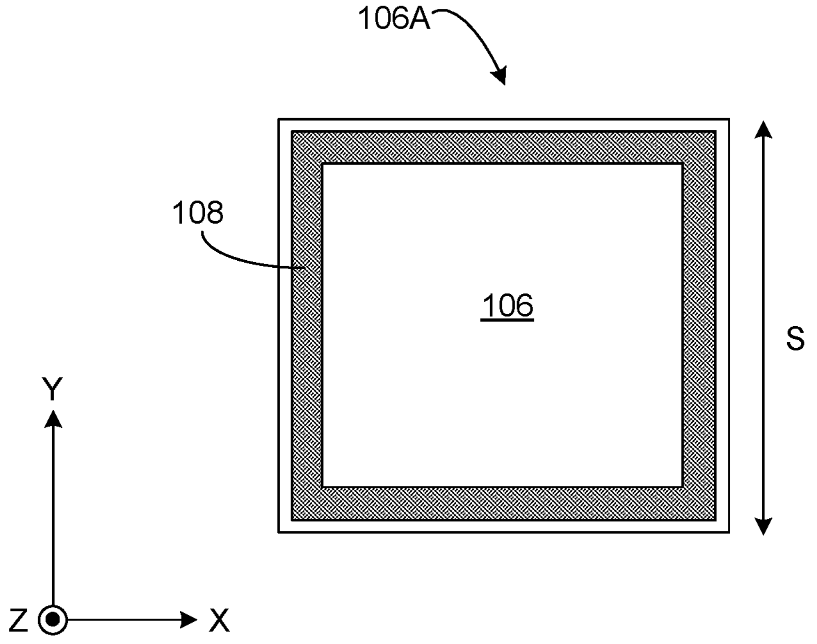
FIG. 1B is a plan view of a lid assembly according to an implementation of the present disclosure.

FIG. 1B shows a top-down plan view of a lid assembly 106A in accordance with some implementations of the present disclosure. The lid assembly 106A includes the transparent lid 106 and the protective dam 108. In some implementations, the transparent lid 106 can have a rectangular shape or a square shape, as shown in FIG. 1B, though the transparent lid 106 is not so limited and can instead have a circular shape, an elliptical shape, and so forth. In some implementations, sides s of a square transparent lid 106 can have a length in a range of about 3 mm to about 10 mm, so that the transparent lid 106 has an area in a range of about 9 $mm^2$ to about 100 $mm^2$.

FIG. 1B further shows that the protective dam 108 can be disposed around a perimeter of the transparent lid 106, in accordance with some implementations of the present disclosure. The protective dam 108 is disposed between the transparent lid 106 and the sensor die 104, e.g., the protective dam is disposed under the transparent lid and above the sensor die 104 to provide a stable support structure for the transparent lid 106. In some implementations, layers of the protective dam 108 can be stacked on top of one another such that they have substantially the same footprint, and such that they extend around substantially the same perimeter, underneath the transparent lid 106, so as to coincide with outer, non-active, areas of the sensor die 104.

Figure 1C:
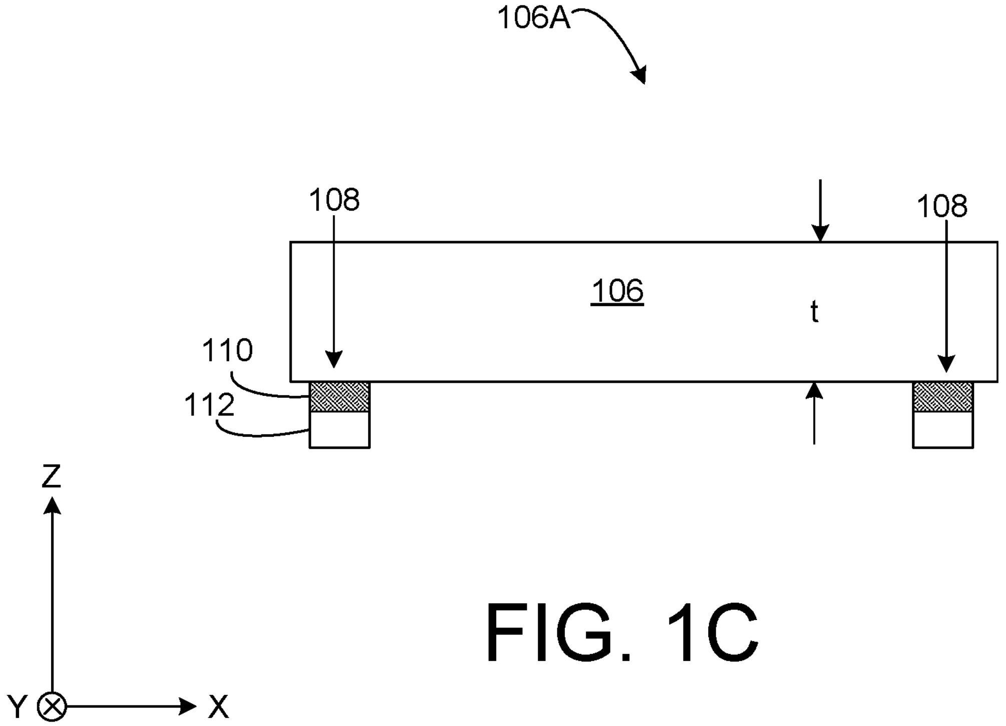
FIG. 1C is a cross-sectional view of the lid assembly shown in FIG. 1B, according to an implementation of the present disclosure.

FIG. 1C shows a magnified cross-sectional view of the lid assembly 106A, in accordance with some implementations of the present disclosure. In some implementations, the protective dam 108 can be a stacked multi-layer epoxy dam that includes at least a first layer, e.g., a first photosensitive adhesive film 110, and a second layer, e.g., a second photosensitive adhesive film 112, as shown in FIG. 1C. In some implementations, the protective dam 108 is a single layer dam that includes only the first photosensitive adhesive film 110.

With reference to FIGS. 1A and 1C, the protective dam 108 ensures that the surrounding encapsulant 116 does not bleed into the gap 109. The protective dam 108 thus prevents lateral contamination of the sensor die 104 and in particular, prevents contamination of the active area 105 of the sensor die 104. In some implementations, the active area 105 is located at or near the center of the sensor die 104. The protective dam 108 can be effective when it is located anywhere between outer edges of the transparent lid and the active area 104. However, the tilt of the transparent lid 106 with respect to the top surface of the sensor die 104 is likely to be minimized when the protective dam 108 is disposed substantially symmetrically around a center of the transparent lid 106.

The protective dam 108 determines the gap height h of the gap 109. The first photosensitive adhesive film 110 and the second photosensitive adhesive film 112 can have approximately the same thickness, or one layer can be substantially thicker than the other layer, provided that the sum of the two-layer thicknesses is equal to a desired height h of the gap 109. In some implementations, the layers of the protective dam 108 can be commercially available adhesive layers, for example, B stage and/or C stage adhesive layers. C stage adhesive layers are initially applied as liquids and then later solidify in response to thermal curing, whereas B stage adhesive layers are solid, partially pre-cured layers that can be liquified and re-solidified during the assembly process of optical sensor module 100.

When the protective dam used to package an optical sensor module 100 is not fully hardened e.g., when a soft material such as a resin is used as one or more layers of the dam, there is a risk that the dam itself can bleed into the gap 109 and contaminate the active area 105 of the sensor die 104. The likelihood that a liquid resin would migrate into the central area of the sensor die 104 and could affect the active area 105 depends on surface properties of the sensor die 104, as well as physical properties of the resin such as viscosity and flowability as a function of temperature. However, when the protective dam 108 as described herein is used, such a risk can be avoided.

Figure 2:
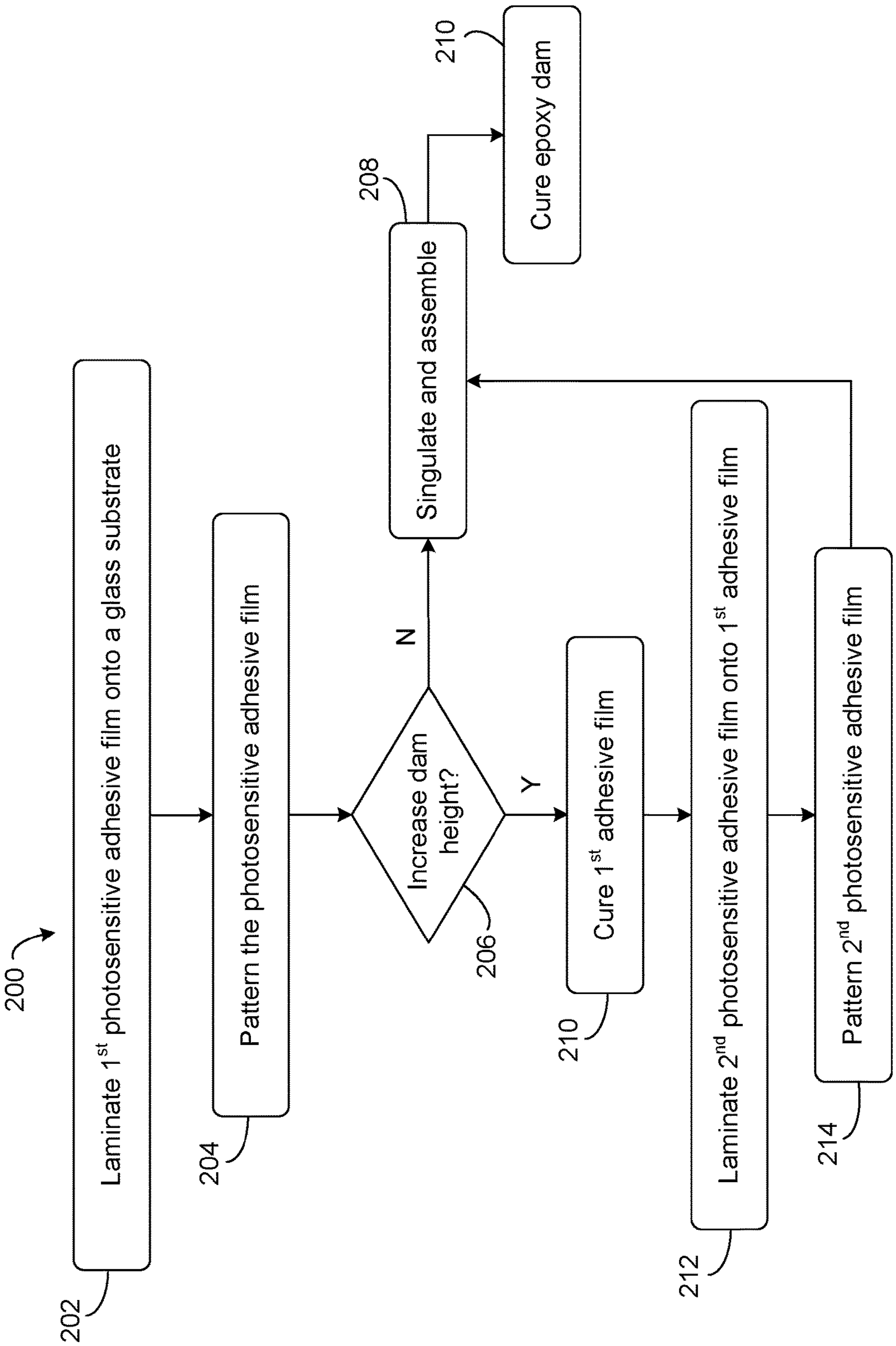
FIG. 2 is a flow diagram illustrating a method of fabricating the optical sensor module shown in FIG. 1A, according to an implementation of the present disclosure.
Figure 3:
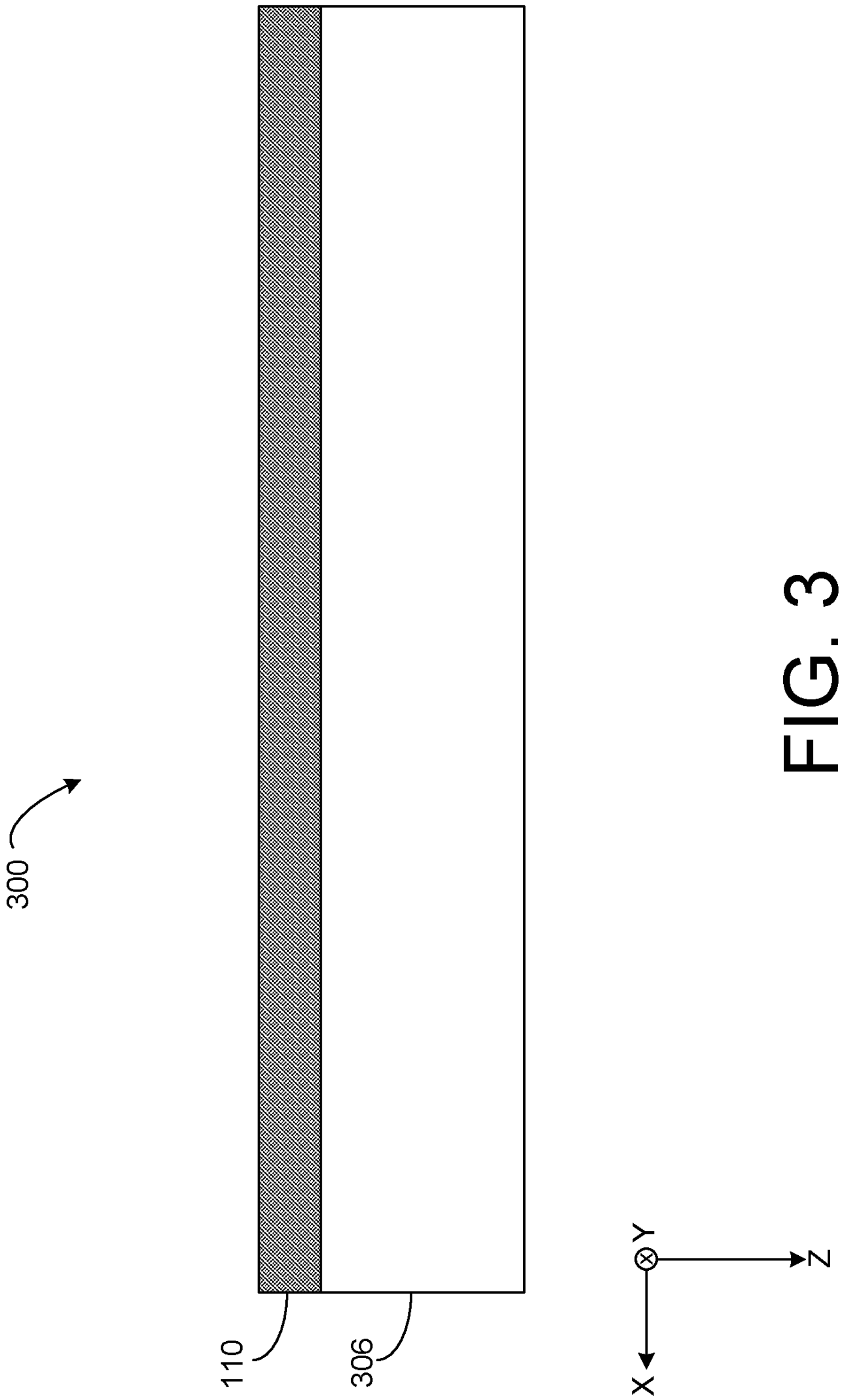
FIGS. 3, 4A, 4B, 5, and 6 illustrate operations in the method shown in FIG. 2, according to an implementation of the present disclosure.

FIG. 2 is a flow chart illustrating a method 200 for fabricating the optical sensor module 100 equipped with the protective dam 108, in accordance with some implementations of the present disclosure. Operations 202-210 of the method 200 can be carried out to form the optical sensor module 100, according to some implementations as described below with respect to FIGS. 3-6. Operations of the method 200 can be performed in a different order, or not performed, depending on specific applications. It is noted that the method 200 may not produce a complete optical sensor module 100. Accordingly, it is understood that additional processes can be provided before, during, or after method 200, and that some of these additional processes may be briefly described herein.

At 202, the method 200 includes covering at least a portion of a surface of the substrate 101 with the first photosensitive adhesive film 110, according to some implementations as shown in FIGS. 3-6 as described below. In the example shown, the substrate is a glass substrate 306 that, when singulated, will form a plurality of transparent lids 106. In some implementations, a transparent polymer substrate can be substituted for the glass substrate 306. In some implementations, the first photosensitive adhesive film 110 is a C-stage adhesive layer that is initially in liquid form, so that the first photosensitive adhesive film 110 can be spun onto the glass substrate 306 in a process similar to a spin coating process used to apply photoresist to semiconductor wafers.

The operation 202 can further include a lamination process, e.g., a process in which the glass substrate 306 that has been coated with the first photosensitive adhesive film 110 is heated to form a bonded laminate 300. In some implementations, the first photosensitive adhesive film 110, as a layer of the bonded laminate 300, can have a thickness of about 30 μm to about 100 μm. The lamination process serves to partially harden, or solidify, the first photosensitive adhesive film 110. Following lamination, the first photosensitive adhesive film 110 is not fully cured so that it retains its adhesive properties and can still act as a bonding agent.

Figure 4A:
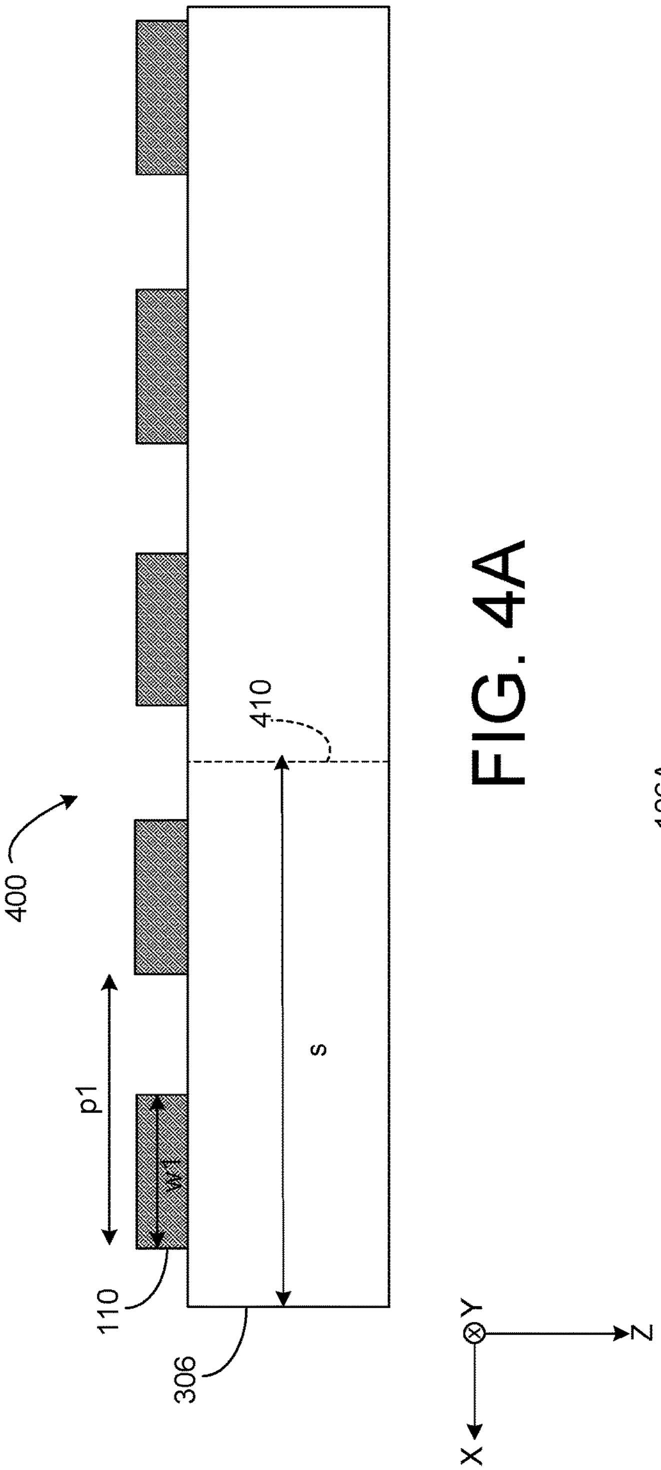
Figure 4B:
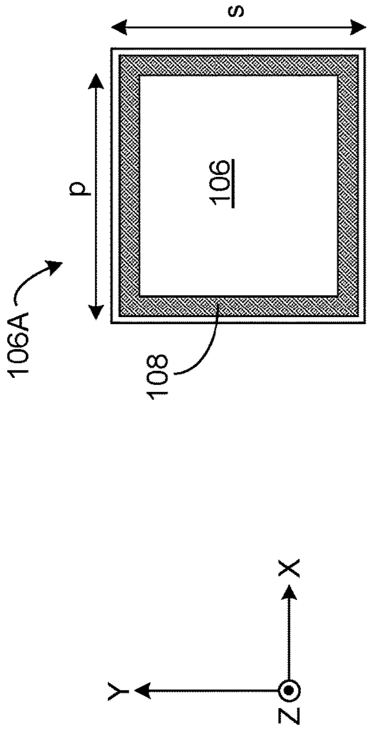

At 204, the method 200 includes patterning the first photosensitive adhesive film 110, according to some implementations as shown in FIG. 4A and FIG. 4B. FIG. 4B reproduces the top plan view of an individual lid assembly 106A. In some implementations, the patterning process may resemble a conventional photolithography process used to pattern a photoresist mask, e.g., exposing the first photosensitive adhesive film 110 to light through an optical mask, and then applying a developer to remove exposed, or unexposed, portions of the first photosensitive adhesive film 110, depending on a chemical composition of the first photosensitive adhesive film 110. Thus, the first photosensitive adhesive film 110 can be patterned directly without use of a contact mask or an etching operation. The resulting pattern 400 is characterized by a feature width w1 and a pitch p1. The pitch p1 defines a distance between repeating features of the first photosensitive adhesive film 110. The pitch p1 will also serve to define the length of the side s of the transparent lid 106. In some implementations, the pitch p1 can be about 5 to about 60 times larger than the feature width w1 and slightly smaller than the square dimension s of the transparent lid 106, as shown in FIG. 4B. For example, the pitch p1 can be in a range of about 200 μm to about 500 μm.

At 206, the method 200 includes assessing whether or not to increase the dam height, according to some implementations of the present disclosure. If the dam height provided by the first photosensitive adhesive film 110 is sufficient, the method 200 can proceed to singulate the epoxy dams 108 on the glass substrate 306 into square units as shown in FIG. 1B, at operation 208. If it is determined to increase the dam height further, for example, to a dam height in the range of about 100 μm to about 200 μm, the method 200 can continue at operation 210 to adjust the dam height, which will determine the overall gap height h of the gap 109.

At 208, the method 200 includes singulating the glass substrate 306 into the lid assemblies 106A and packaging the lid assemblies 106A into the optical sensor modules 100, according to some implementations as shown in FIG. 4A and FIG. 4B. Singulation may include a process of cutting, sawing, or scoring the glass substrate 306 along singulation cut lines, e.g., along singulation boundaries 410, to separate square sections of the glass substrate 306, thus forming the individual lid assemblies 106A shown in FIG. 1B and FIG. 1C. The singulation boundaries 410 are located between pairs of patterned features of the first photosensitive adhesive film 110. In some implementations, the singulation boundaries 410 can be located approximately mid-way between two patterned features so that singulation will not disturb the first photosensitive adhesive film 110. The singulation technique used for a glass substrate 306 can be similar to that used to singulate a semiconductor wafer into individual dies or chips. If the transparent substrate used is made of a polymer material, a different or modified singulation technique may be employed to achieve a clean cut along the singulation boundaries 410.

Following singulation, each lid assembly 106A can be inverted and attached to a corresponding sensor die 104. The lid assembly 106A can be positioned on the sensor die 104 so that the first photosensitive adhesive film 110 makes contact with inactive areas of the sensor die 104. The inactive areas are the regions between the active area 105 and metal pads near edges of the sensor die 104, to which the wire bonds 114 are coupled. Because the pitch p1 is slightly less than the side s, when the lid assembly 106A is inverted, the transparent lid 106 slightly overhangs the protective dam 108.

At 210, the method 200 includes curing the first photosensitive adhesive film 110. If it has been determined that the protective dam 108 is to be a single-layer dam, the cure operation will be the final step in the method 200. If it has been determined that the protective dam 108 is to be a two-layer dam, a first cure operation will apply to the first photosensitive adhesive film 110 and later, the cure operation can be repeated following singulation of the two-layer protective dam 108. In some implementations, the cure operation can be accomplished by applying a thermal treatment to the first photosensitive adhesive film 110 that includes heating the first photosensitive adhesive film 110 to a temperature of at least about 100 to about 200 degrees C. Additionally, or alternatively, the cure operation for some compositions of the first photosensitive adhesive film 110 may include exposure to ultraviolet (UV) light.

Figure 5:
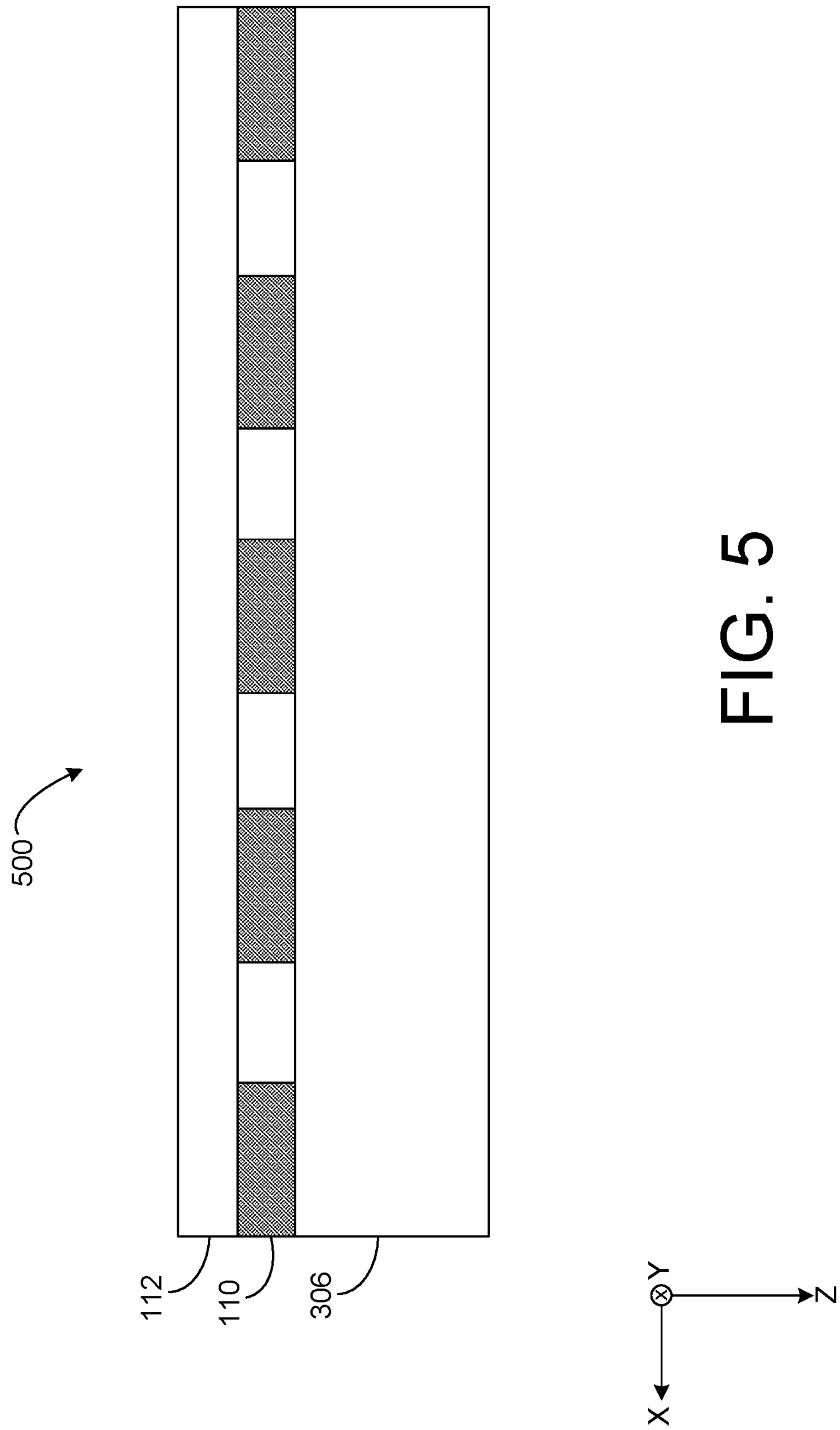

At 212, the method 200 includes covering the first photosensitive adhesive film 110 with the second photosensitive adhesive film 112, according to some implementations as shown in FIG. 5. The second photosensitive adhesive film 112 can be applied to the first photosensitive adhesive film 110 as a rigid layer, as opposed to the spin-on liquid form that characterized application of the first photosensitive film 110. In some implementations, the second photosensitive adhesive film 112 is a B-stage adhesive film made of a solid, partially pre-cured material that can be dry laminated over the first photosensitive adhesive film 110. In response to applying heat and pressure later in the process, such a B-stage adhesion film may become flowable so that it can be used as an adhesive between the first photosensitive adhesive film 110 and the inactive area of the optical sensor die 104.

Figure 6:
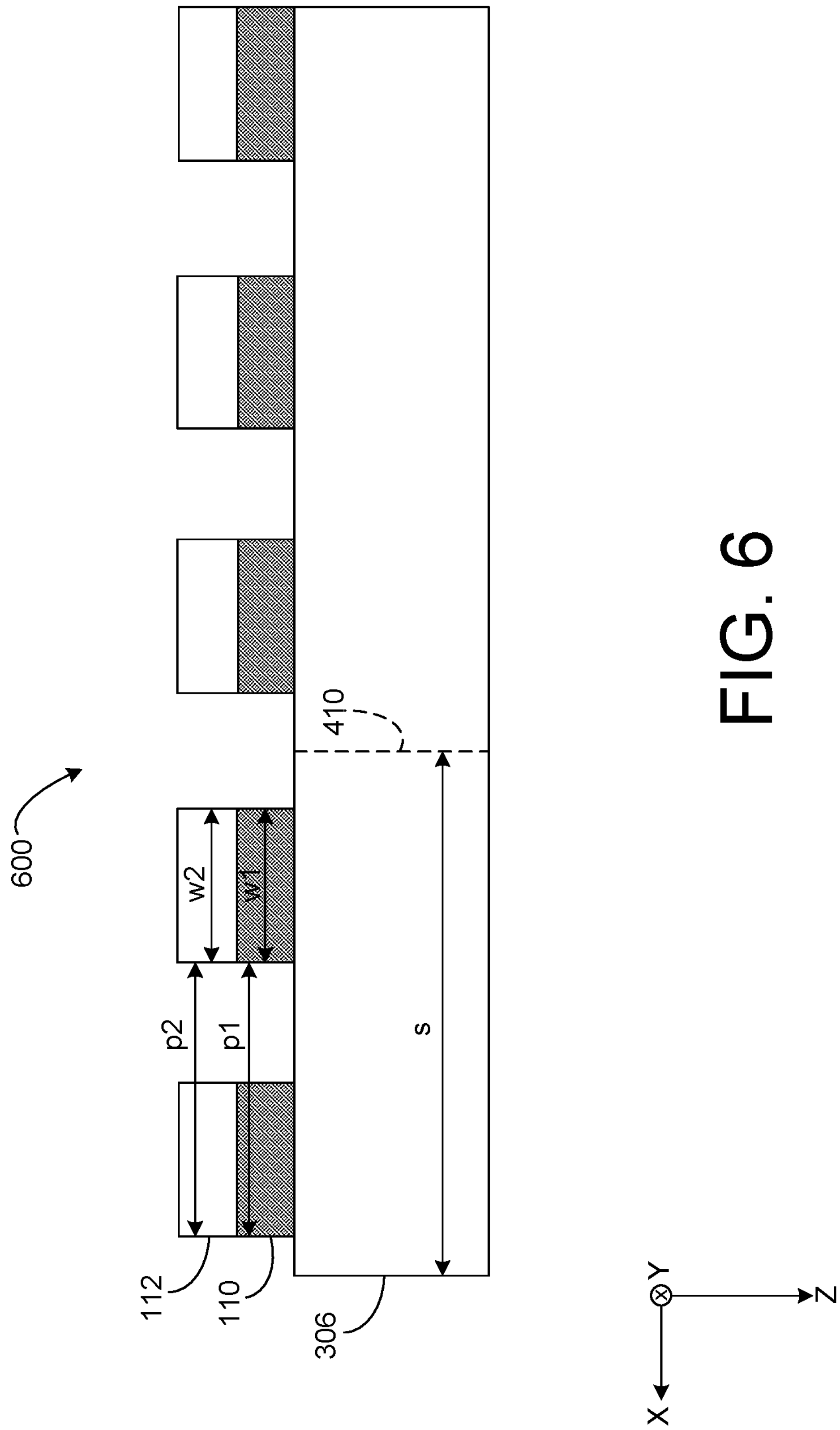

At 214, the method 200 includes patterning the second photosensitive adhesive film 112, according to some implementations as shown in FIG. 6. The patterning process for the second photosensitive adhesive film 112 can be similar to the patterning process described above for the first photosensitive adhesive film 110. Thus, the patterning process for the second photosensitive adhesive film 112 may resemble a conventional process used to pattern a photoresist mask, e.g., exposing the second photosensitive adhesive film 112 to light through an optical mask, and then applying a developer to remove exposed, or unexposed, portions of the second photosensitive adhesive film 112, depending on a chemical composition of the second photosensitive adhesive film 112. Thus, the second photosensitive adhesive film 112 can be patterned directly without use of a contact mask or an etching operation. The resulting pattern 600 is characterized by a feature width w2 and a pitch p2. The pitch p2 defines a distance between repeating features of the second photosensitive adhesive film 112. The pitch p2 may also serve to define a length of the side s of the transparent lid 106. In some implementations, the pitch p2 can be 5 to 10 times larger than the feature width w2 and slightly smaller than the square dimension s of the transparent lid 106. In the example shown in FIG. 1A, FIG. 1C, and FIG. 6, the pitch p2 is substantially equal to the pitch p1 and the feature width w2 is substantially equal to the feature width w1, so that the first photosensitive adhesive film 110 and the second photosensitive adhesive film 112 together form a uniform stacked arrangement having substantially vertical profiles.

Alternatively, in some implementations, the pitches p1 and p2 can differ slightly from one another, and/or the feature widths w1 and w2 can differ slightly from one another. Consequently, some implementations of the protective dam 108 can form, for example, a stack having a graduated profile in which the base layer is wider than the top layer, thus forming a protective dam 108*p* having a pyramidal structure, or the top layer is wider than the base layer, thus forming a protective dam 108*r* having a retrograde structure. In such arrangements, it may be advantageous for the two patterned layers of the protective dam 108 to be centered with respect to one another.

Figure 7A:
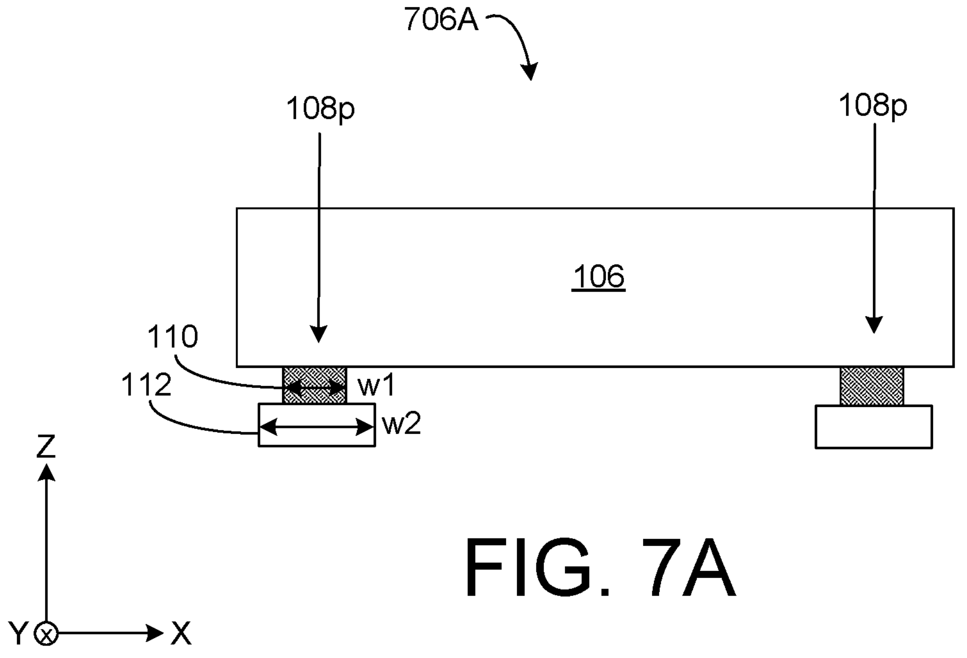
FIGS. 7A and 7B are cross-sectional views of a multi-layer protective dam, according to implementations of the present disclosure.
Figure 7B:
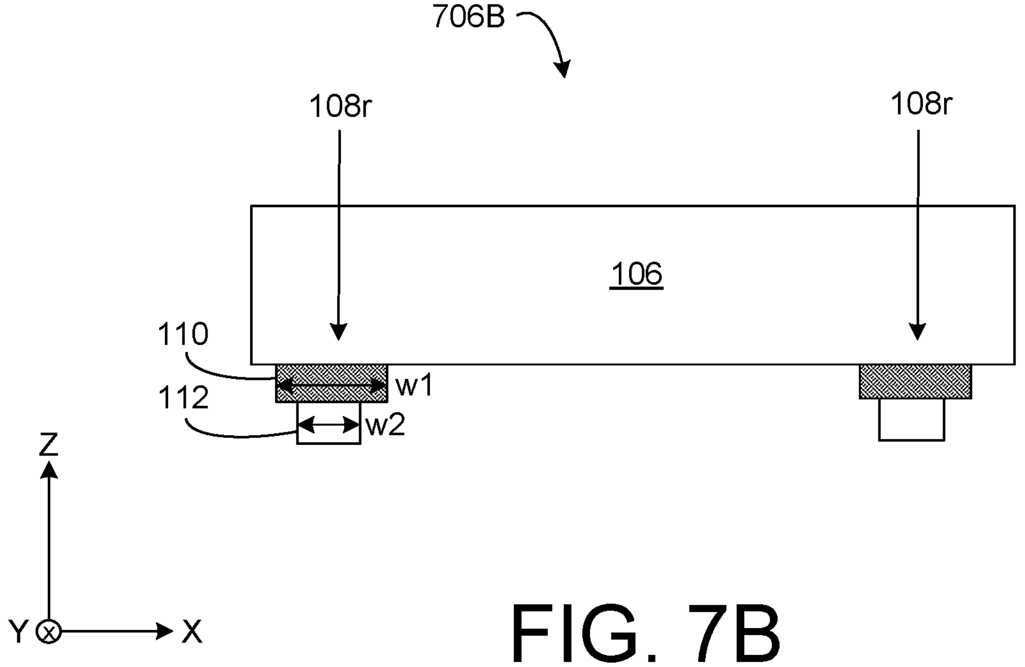

A lid assembly 706A in which the protective dam 108*p* has graduated profiles with a pyramidal structure (w1<w2) is illustrated in FIG. 7A; a lid assembly 706B in which the protective dam 108*r* has graduated profiles with a retrograde structure (w1>w2) is illustrated in FIG. 7B. An advantage of the pyramidal structure shown in FIG. 7A is greater structural stability with less stringent requirements for the relative pitch and width dimensions of the layers within the protective dam 108. An advantage of the retrograde structure shown in FIG. 7B is that it has a smaller footprint that will accommodate tighter dimensions of the inactive area of the sensor die 104. In both FIG. 7A and FIG. 7B, the stacked layers of the protective dam 108 are substantially centered with respect to one another. Alternatively, in some implementations, the two patterned layers of the protective dam 108 can be offset from one another e.g., not centered with respect to one another.

Following operation 214, the method 200 includes singulating the glass substrate 306 bearing pattern 600 along singulation boundaries 410 and packaging lid assemblies 106A as described above with reference to operation 208. Following singulation, when an individual lid assembly 106A that includes a two-layer protective dam 108 is inverted and positioned on the sensor die 104, it is the second photosensitive adhesive film 112 that makes contact with inactive areas of the sensor die 104. Because the second photosensitive adhesive film 112 is a B-stage adhesive that is not fully cured, it can still retain sufficient bonding properties when heat and pressure are applied using an accurate assembly bonder. That is, when applying heat and/or pressure to a B-stage adhesive film, the film can become flowable so as to adhere the lid assembly 106A to the sensor die 104. An advantage of the B-stage adhesive over a conventional epoxy is that the B-stage adhesive can continue to be manipulated throughout the fabrication process until the final cure operation 210. Use of a B-stage adhesive therefore provides greater flexibility in the timing and order of processing operations in the method 200.

Finally, the method 200 includes repeating the cure operation 210 to form a fully cured protective dam 108. In some implementations, the cure operation 210 can be accomplished by applying a thermal treatment to the two-layer protective dam 108 including both the first photosensitive adhesive film 110 and the second photosensitive adhesive film 112. Additionally, or alternatively, the cure operation 210 for some compositions of the first photosensitive adhesive film 110 and the second photosensitive adhesive film 112 may include exposure to ultraviolet (UV) light. A full curing process can transform the second photosensitive adhesive film 112, as a B-stage adhesive film, into a C-stage adhesion film, which may provide sufficient rigidity to prevent the transparent lid 106 from tilting substantially with respect to the sensor die 104. In some implementations, the second photosensitive adhesive film 112 can have a thickness in a range of about 10 μm to about 20 μm after it is fully cured. In some implementations, the first and second photosensitive films 110 and 112, respectively, can have different thicknesses, or different relative thicknesses, than those presented herein.

Following completion of the method 200, the substrate 101, the sensor die 104, the lid assembly 106A, and the wire bonds 114 can be sealed by the encapsulant 116, e.g., an epoxy molding compound (EMC) to form the optical sensor module 100. Encapsulation can be accomplished using, for example, an injection molding process. The solder balls 118 can then be attached to a metal layer on the back side of the substrate 101.

As described above, the protective dam 108 fabricated by the method 200 serves two important functions within the optical sensor module 100. First, the protective dam 108 surrounds the active area of the sensor die 104 to protect the optical sensor from contamination. Second, the protective dam 108 provides a solid, non-compressible foundation of uniform height that allows the transparent lid 106 to remain substantially co-planar with the upper surface 103 of the sensor die 104. By using multiple layers, the separation between the transparent lid 106 and the sensor die 104 can be adjusted.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An apparatus, comprising:

a substrate;

an optical sensor die coupled to an upper surface of the substrate;

a multi-layer epoxy dam bonded to the optical sensor die, the multi-layer epoxy dam including a first film bonded to a top surface of the optical sensor die and a second film disposed directly on the first film, wherein at least the first film is chemically reactive to light and a developer, and wherein the first film has a lateral width that is equal to or greater than a lateral width of the second film;

a transparent lid coupled to the multi-layer epoxy dam;

a wire bond providing an electrical connection between the optical sensor die and circuit elements in the substrate; and an encapsulant disposed around at least a portion of the transparent lid, the multi-layer epoxy dam, the optical sensor die, and the wire bond.

2. The apparatus of claim 1, wherein the transparent lid is rectangular, and the multi-layer epoxy dam is disposed around a perimeter of the transparent lid.

3. The apparatus of claim 1, further comprising a plurality of solder balls attached to a lower surface of the substrate.

4. The apparatus of claim 1, wherein the encapsulant is a liquid epoxy solidified by thermally curing.

5. The apparatus of claim 1, wherein the substrate includes one or more of a ceramic material, a glass material, a semiconductor material, an organic material, a resin material, a laminate, and a printed circuit board.

6. The apparatus of claim 1, wherein the second film of the multi-layer epoxy dam is a photo-patternable adhesive film.

7. The apparatus of claim 1, wherein the transparent lid has an area between 9 $mm^2$ and 100 $mm^2$.

8. The apparatus of claim 1, wherein the transparent lid has a thickness between 200 μm and 1 mm.

9. The apparatus of claim 1, wherein the multi-layer epoxy dam is a two-layer epoxy dam having a total thickness between 30 μm and 100 μm.

10. The apparatus of claim 9, wherein the two-layer epoxy dam includes a fully cured C-stage adhesive layer and a fully cured B-stage adhesive layer.

11. An apparatus, comprising:

an optical sensor die coupled to an upper surface of a substrate, the optical sensor die including a photosensitive region;

a first adhesive film bonded to a top surface of the optical sensor die;

a second adhesive film coupled directly to the first adhesive film, the first adhesive film and the second adhesive film defining an area in which the photosensitive region is disposed, wherein the first adhesive film and the second adhesive film are chemically reactive to light and a developer;

a transparent lid bonded to the second adhesive film; and an encapsulant disposed around at least a portion of the transparent lid, the first adhesive film, the second adhesive film, and the optical sensor die.

12. The apparatus of claim 11, wherein the second adhesive film has a width that is equal to that of the first adhesive film.

13. The apparatus of claim 11, wherein the first adhesive film and the second adhesive film have exposure-dependent removability in a developer.

14. The apparatus of claim 11, wherein the first adhesive film is a fully cured B-stage adhesive layer and the second adhesive film is a fully cured C-stage adhesive layer.

15. The apparatus of claim 11, wherein the first adhesive film and the second adhesive film define a gap between the transparent lid and the photosensitive region.

16. The apparatus of claim 15, wherein a height of the gap is between 30 μm and 100 μm.

17. An apparatus, comprising:

an optical sensor die coupled to an upper surface of a substrate;

a first photosensitive adhesive layer patterned on the optical sensor die;

a second photosensitive adhesive layer patterned directly on the first photosensitive adhesive layer; wherein the first photosensitive adhesive layer has a lateral width that is equal to or greater than a lateral width of the second photosensitive adhesive layer; and a transparent lid bonded to the second photosensitive adhesive layer, the first photosensitive adhesive layer and the second photosensitive adhesive layer defining a gap between the transparent lid and the optical sensor die.

18. The apparatus of claim 17, wherein the first photosensitive adhesive layer and the second photosensitive adhesive layer differ in height.

19. The apparatus of claim 1, wherein the first film and the second film have exposure-dependent removability in a developer.

20. The apparatus of claim 17, wherein the first photosensitive adhesive layer and the second photosensitive adhesive have exposure-dependent removability in a developer.

* * * * *